(12) United States Patent
Dyer

(10) Patent No.: US 7,772,095 B2
(45) Date of Patent: Aug. 10, 2010

(54) INTEGRATED CIRCUIT HAVING LOCALIZED EMBEDDED SIGE AND METHOD OF MANUFACTURING

(75) Inventor: Thomas W Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/127,887

(22) Filed: May 28, 2008

(65) Prior Publication Data

US 2009/0294894 A1 Dec. 3, 2009

(51) Int. Cl.
*H01L 21/20* (2006.01)
(52) U.S. Cl. .............. 438/478; 438/202; 438/242; 438/270; 438/285; 438/300; 257/E21.431
(58) Field of Classification Search ........... 438/249
See application file for complete search history.

(56) References Cited

U.S. PATENT DOCUMENTS

| 7,226,820 | B2 | 6/2007 | Zhang et al. | |
| 2006/0138398 | A1 | 6/2006 | Shimamune et al. | |
| 2006/0220113 | A1* | 10/2006 | Tamura et al. | 257/335 |
| 2007/0012913 | A1 | 1/2007 | Ohta et al. | |
| 2007/0018205 | A1 | 1/2007 | Chidambarrao et al. | |
| 2007/0057324 | A1* | 3/2007 | Tews et al. | 257/347 |
| 2007/0190730 | A1 | 8/2007 | Huang et al. | |
| 2008/0006884 | A1 | 1/2008 | Yagishita | |
| 2009/0184341 | A1* | 7/2009 | Chong et al. | 257/190 |

* cited by examiner

*Primary Examiner*—N Drew Richards
*Assistant Examiner*—Kyoung Lee
(74) *Attorney, Agent, or Firm*—Joseph Petrokaitis; Roberts Mlotkowski Safran & Cole, P.C.

(57) ABSTRACT

An integrated circuit (IC) with localized SiGe embedded in a substrate and a method of manufacturing the IC is provided. The method includes forming recesses in a substrate on each side of a gate structure and remote from a shallow trench isolation structure. The method further includes growing a stress material within the recesses such that the stress material is bounded on its side only by the substrate.

20 Claims, 7 Drawing Sheets

US 7,772,095 B2

INTEGRATED CIRCUIT HAVING LOCALIZED EMBEDDED SIGE AND METHOD OF MANUFACTURING

FIELD OF THE INVENTION

The present invention relates to integrated circuits (ICs) and methods of manufacturing the IC and, more particularly, to an IC having embedded localized SiGe bounded by a substrate and a method of manufacturing the IC.

BACKGROUND

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the NFETs and/or PFETs.

In order to maximize the performance of NFETs and PFETs within integrated circuit (IC) chips, the stress components should be engineered and applied differently for NFETs and PFETs as the type of stress beneficial for the performance of an NFET is generally disadvantageous for the performance of the PFET. More particularly, when a device is in tension, the performance characteristics of the NFET are enhanced while the performance characteristics of the PFET are diminished.

In known processes for implementing stresses in FETs, distinct processes and/or materials are used to create such stresses. For example, as shown in FIG. 1, it is known to grow SiGe in recesses in the substrate which are in contacted and bounded by an STI structure. According to this method, the substrate between the gate structure and the isolation region (STI) is etched to form recesses. These recesses are bounded by the STI structure and more particularly the oxide material which forms the STI structure. However, in these known methods, the SiGe material does not grow uniformly within the recesses due to its faceted profile. In fact, due to the characteristics of the SiGe and remaining structure, the SiGe has a tendency to grow faster along sidewalls of the substrate, e.g., silicon, than the oxide of the STI structure.

Due to this faceted profile, a triangular-shaped trench forms along the STI structure that extends to the bottom of the silicon recess. This trench results in serious processing problems such as, for example, junction leakage problems. More specifically, the junction leakage problem results from silicide being taken down to the bottom of the silicon recess during subsequent processing steps. Also, the trench makes it more difficult to ensure desired topography when patterning with lithographic processes. Another problem is the dependence of the performance enhancement on the spacing between devices. This dependence is due to the recess RIE loading, amongst other factors.

Accordingly, there exists a need in the art to overcome the deficiencies and limitations described hereinabove.

SUMMARY

In a first aspect of the invention, a method comprises forming recesses in a substrate on each side of a gate structure and remote from a shallow trench isolation structure. The method further comprises growing a stress material within the recesses such that the stress material is bounded on its side only by the substrate.

In a another aspect of the invention, a method of forming a device comprises forming a gate structure on a substrate between shallow trench isolation structures. The method further comprises forming sacrificial spacers on the sides of the gate structure. The sacrificial spacers extend partially to the trench isolation structures. The method further comprising forming a recessed mask on sides of the sacrificial spacers which is at a height below the sacrificial spacers such that portions of the sacrificial spacers remain exposed. The method also comprises etching the sacrificial spacers and any intervening material to expose the substrate, etching the substrate to form recesses which are substantially a same width as the sacrificial spacers, and growing SiGe material within the recesses such that the SiGe material is bounded on its sides by the substrate and remote from the shallow trench isolation structures.

In a further aspect of the invention, a structure comprises an embedded localized SiGe in a substrate on sides of a gate structure and remote from shallow trench isolation structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates to an integrated circuit (IC) with localized SiGe embedded in a substrate and a method of manufacturing the IC. In embodiments, the embedded localized SiGe is bounded by the substrate and is remote from shallow trench isolation (STI) structures. That is, the embedded SiGe is not bounded or in contact with the material (e.g., oxide) of the STI structures. As the SiGe is epitaxially grown and is selective to oxide, the method and structure of the present invention results in an embedded SiGe layer which can be uniformly grown, thereby eliminating any gaps or spaces at the junction of the bounded area, i.e., between the substrate and the SiGe. This provides many advantages over known methods and structures such as, for example, providing a uniform performance gain regardless of the transistor spacing or density. Also, by using the methods of the present invention it is possible to ensure that no unwanted material, e.g., silicide, will interfere with the performance gain, i.e., elimination of the gap will ensure that there is no junction leakage due to the silicide at a bottom of the silicon recess.

Figure 1:
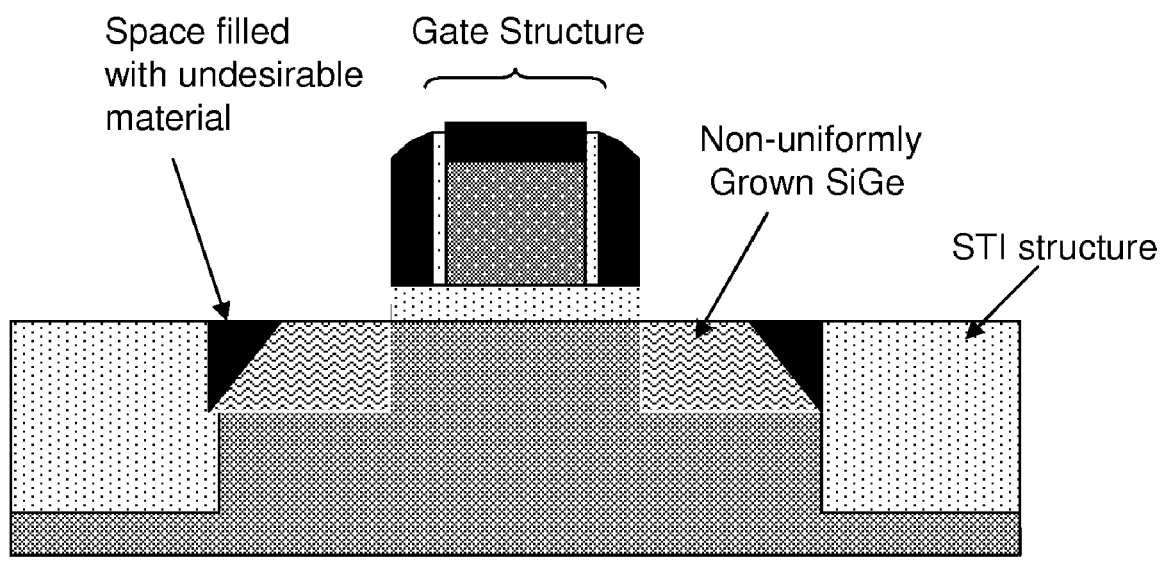
FIG. 1 shows a cross sectional view of a conventional structure with embedded SiGe bounded by an STI structure.
Figure 2:
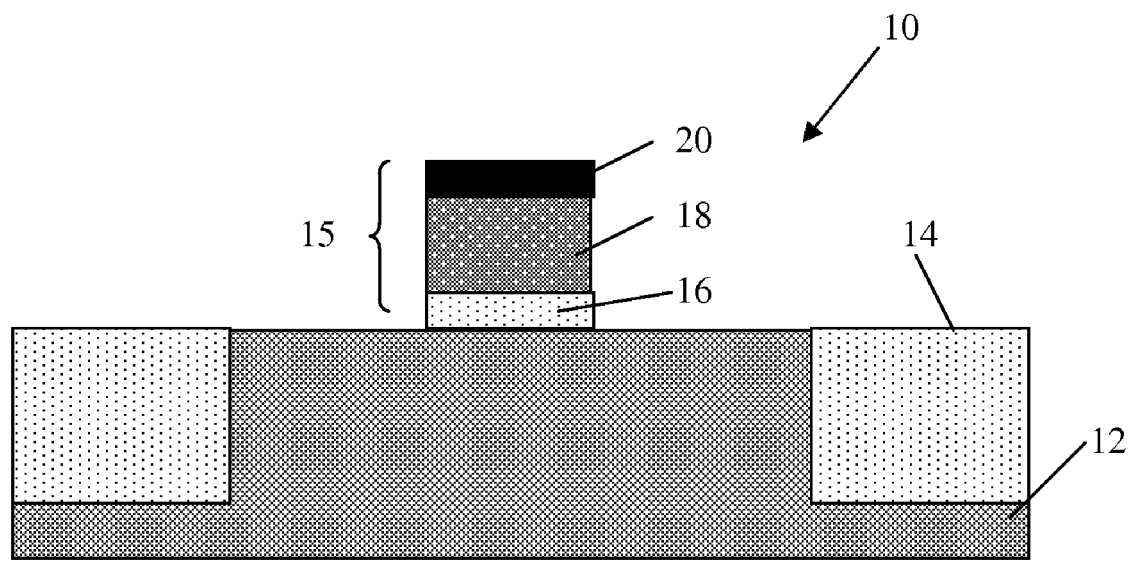
FIGS. 2-11 show fabrication processes and respective structures in accordance with an aspect of the invention.

FIG. 2 shows a beginning structure and respective processing steps in accordance with the invention. The beginning structure 10 includes a substrate 12 such as, for example, silicon. STI structures 14 are formed in the substrate 12 using conventional fabrication processes. For example, using conventional lithographic and etching processes, a shallow trench can be formed in the substrate 12. Oxide material can be deposited in the shallow trench and then planarized to form the STI structures 14. In embodiments, the STI structures 14 may be about 250 nm in depth; although, other dimensions are contemplated by the invention.

As further seen in FIG. 2, a beginning gate structure 15 is formed using conventional gate formation processes. These conventional gate formation processes include, for example, deposition, lithographic and etching processes known to those of skill in the art. More specifically, in embodiments, the gate structure 15 includes a gate oxide layer 16, a gate polysilicon body 18 and a nitride capping layer 20.

In an illustrative embodiment, the gate structure 15 is about 40 Å and about 1000 Å high; although other dimensions are also contemplated by the present invention. For example, those of skill in the art will recognize that narrower gate structures can be implemented with the present invention which will provide higher device performance. As such, the present invention should not be limited to the exemplary dimensions described herein. In further embodiments, the gate structure 15 may be about 50 nm to 100 nm from the STI structures 14, depending on the density of the device.

Figure 3:
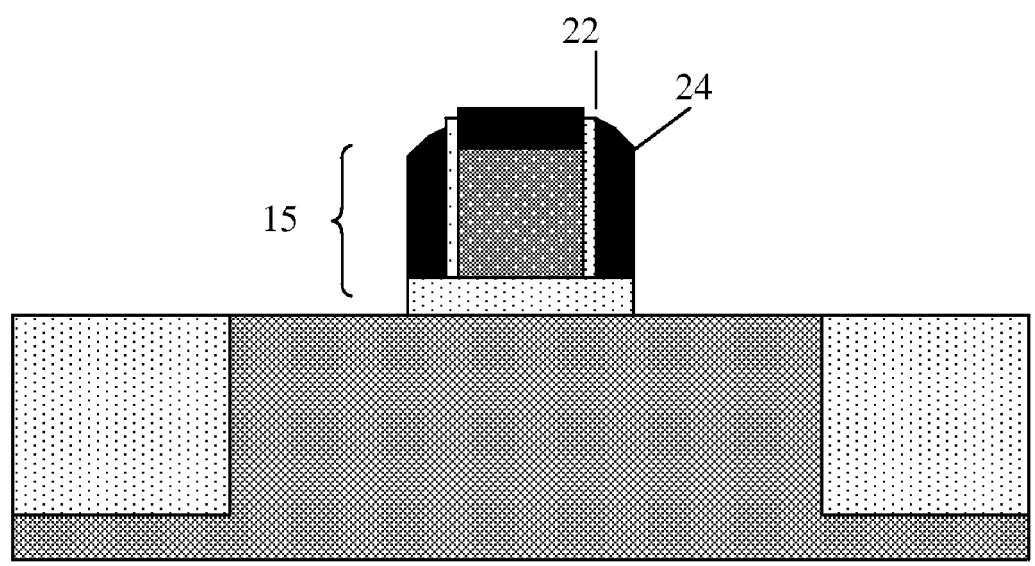

As seen in FIG. 3, an oxide liner 22 is deposited over the structure of FIG. 2. Also, a nitride spacer 24 is deposited on the oxide liner 22, adjacent to the gate structure 15. As a result of a wet or dry etching process, those portions of the oxide liner 22 that are not protected by the nitride spacer 24 are removed from a surface of the structure. This results in the formation of the structure of FIG. 3.

Figure 4:
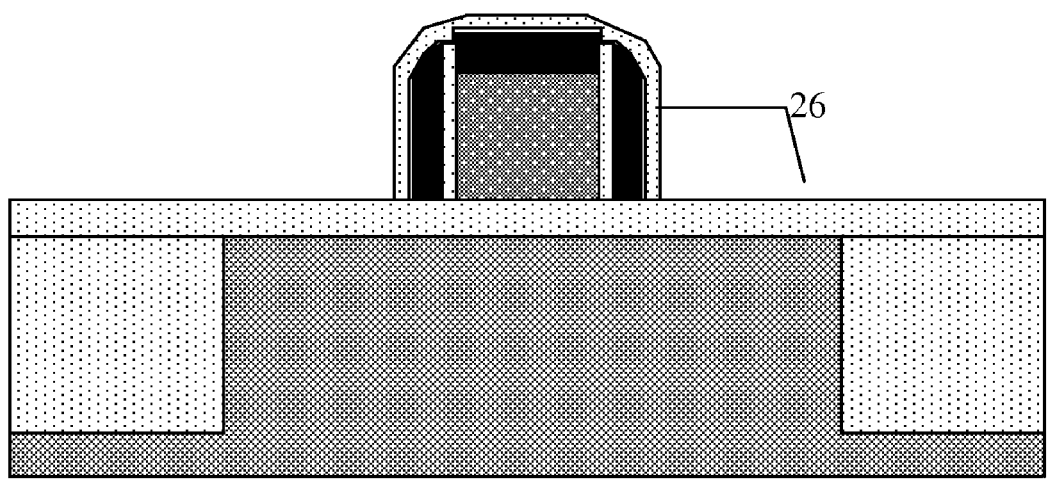

As seen in FIG. 4, a conformal oxide deposition process is used to provide the structure of FIG. 4. More specifically, the conformal oxide deposition process results in an oxide layer 26 deposited over the structure.

Figure 5:
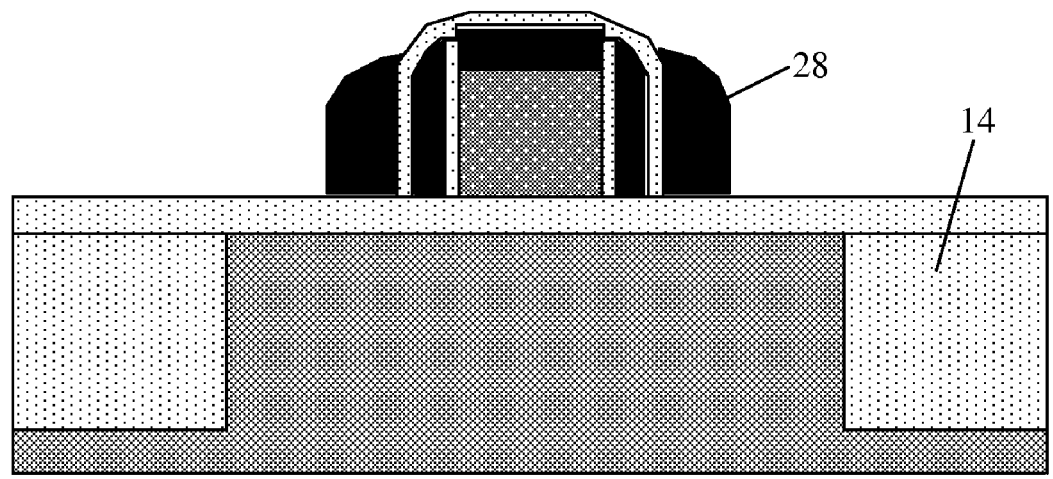

As seen in FIG. 5, sacrificial nitride spacers 28 are formed on the side of the gate structure. In embodiments, the nitride spacers 28 are formed using conventional deposition and etching processes known to those of skill in the art. In embodiments, the thickness of the nitride spacers 28 is comparable to a minimum gate dimension, e.g., one half to one times the dimension of the gate structure. In embodiments, the nitride spacers 28 can be any thickness, but preferably should not bound, abut or extend beyond the STI structures 14. In this way, in subsequent processing steps, recesses formed in the substrate 12 will not be bounded or abut against the STI structures 14, thus allowing, e.g., SiGe material to uniformly grow, thereby eliminating and gaps or spaces at a bounded junction.

Figure 6:
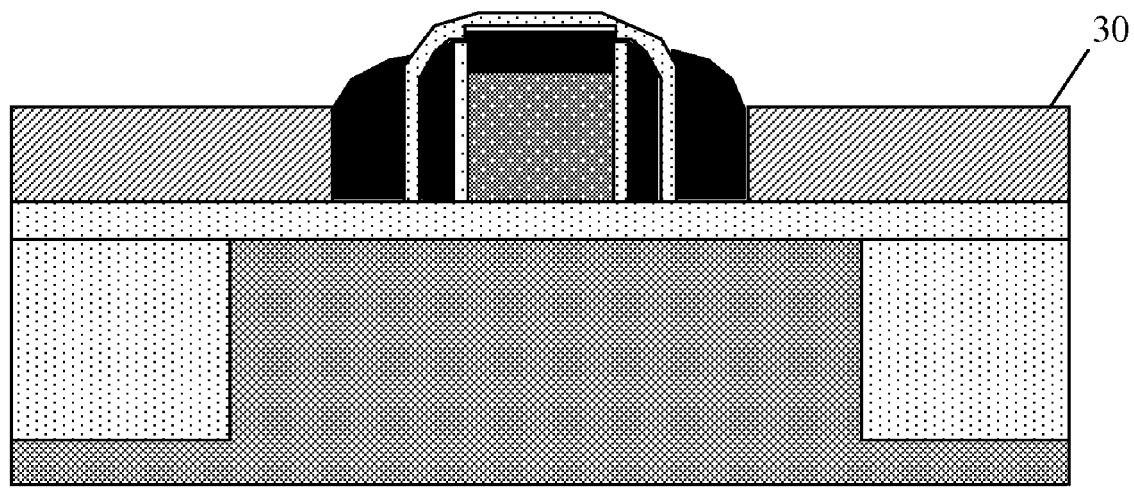

FIG. 6 shows a recessed resist or mask 30 adjacent to the nitride spacers 28. In embodiments, the resist 30 is a spin on resist or a planarizing polymer material. In embodiments, after the resist 30 is deposited on the structure, a uniform dry etch, for example, can be performed to recess the resist below a surface of the nitride spacers 28. This will expose the nitride spacers 28 so that a subsequent etching process can remove the nitride spacers 28 and form recesses in the substrate 12.

Figure 7:
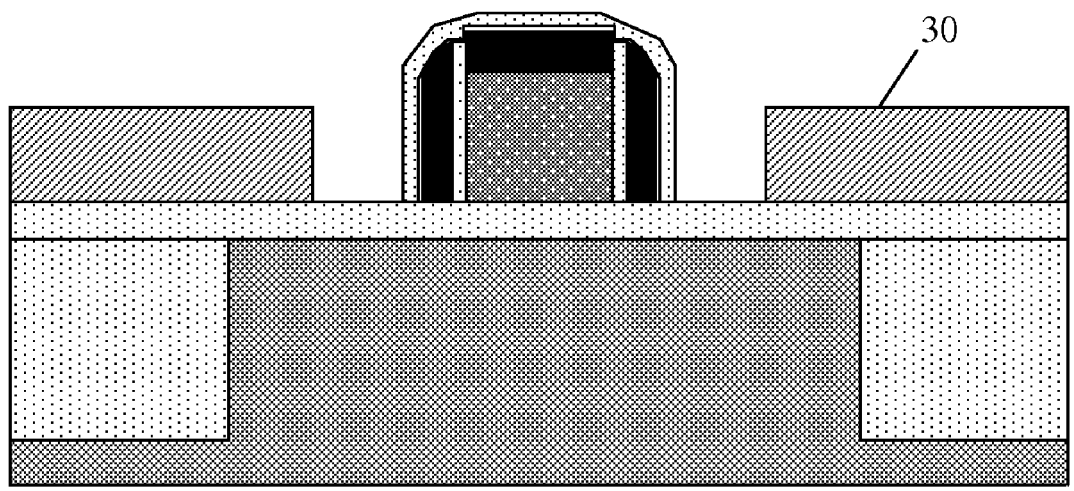
Figure 8:
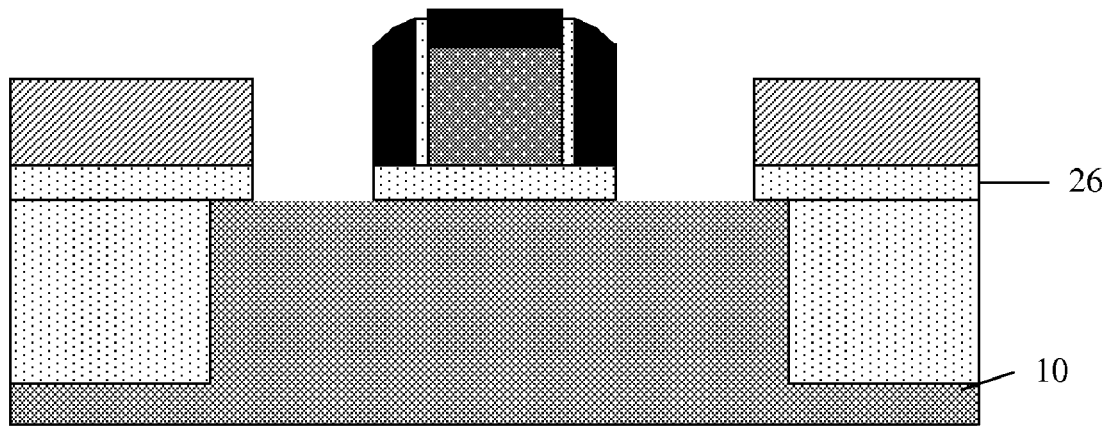

As seen in FIG. 7, the nitride spacers 28 are removed by a conventional etching process. As seen in FIG. 8, the exposed oxide liner 26 is removed by an additional conventional etching process. This etching process exposes the underlying substrate 10.

Figure 9:
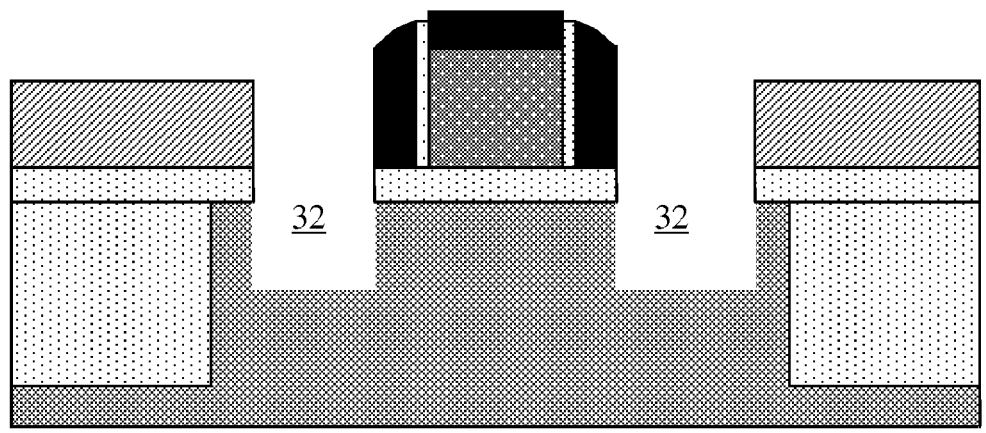

As seen in FIG. 9, recesses 32 are formed in the substrate 10, using a conventional etching process. The width dimension of the recesses 32 correspond to the width dimension of the nitride spacers 28. As such, the recesses 32 are entirely bounded within the substrate 12, remote from the STI structures 14. Thus, any material deposited within the recesses 32 will not contact the STI structures 14 provided many advantages as discussed herein. The depth of the recesses 32 can range from about 50 nm to 100 nm and, in embodiments, is about 80 nm. Also, advantageously, the processes of the present invention ensure that the recesses 32 are of uniform width and depth, all of which are based on engineering designs depending on a particular implementation.

Figure 10:
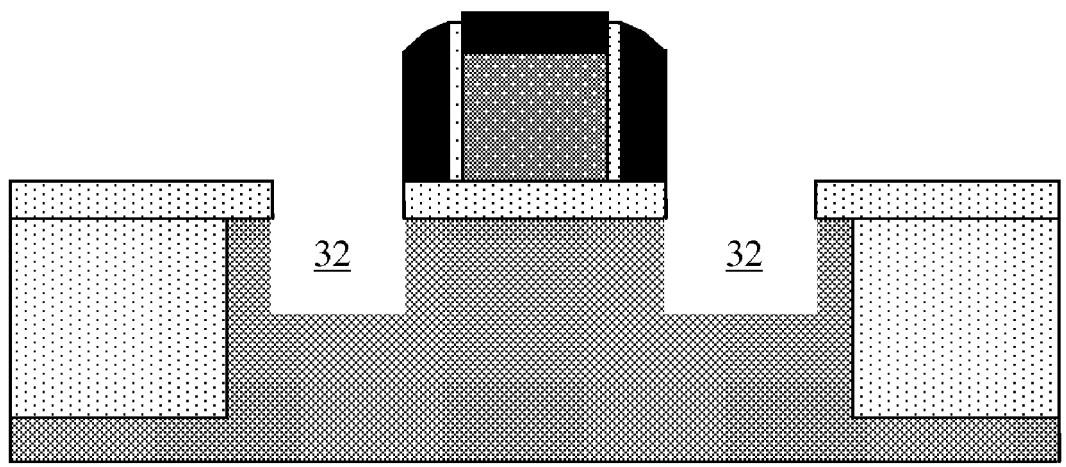

As seen in FIG. 10, the resist is stripped using a conventional stripping process known to those of skill in the art. For example, the resist can be stripped using a standard $O_2$ dry etch or a sulfuric peroxide wet etch.

Figure 11:
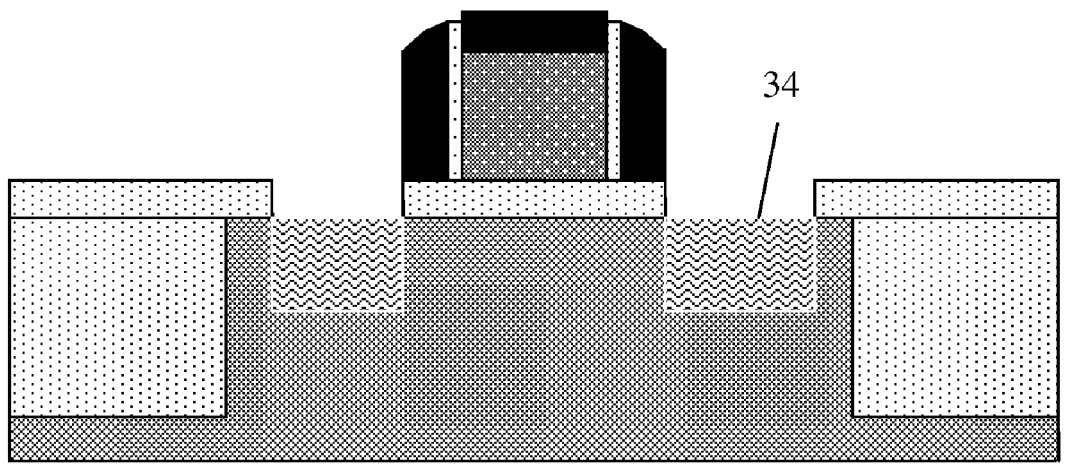

As seen in FIG. 11, a stress material such as, for example, SiGe material 34, is epitaxially grown in the recesses 32. As the SiGe is bounded only by the substrate 10, it is possible to uniformly grow the SiGe material 34 without formation of any gaps or spaces between the SiGe material 34 and the substrate 12. This, in turn, results in a more uniform performance gain across devices, regardless of device density and/or spacing. Also, by not having any gaps or empty spaces at the junction, no undesirable materials, e.g., silicide, will be deposited in unwanted areas which may interfere with the performance gain of the device. That is, by not having silicide formed in empty spaces, the present invention eliminates junction leakage due to the silicide at a bottom of the silicon recesses.

Figure 12:
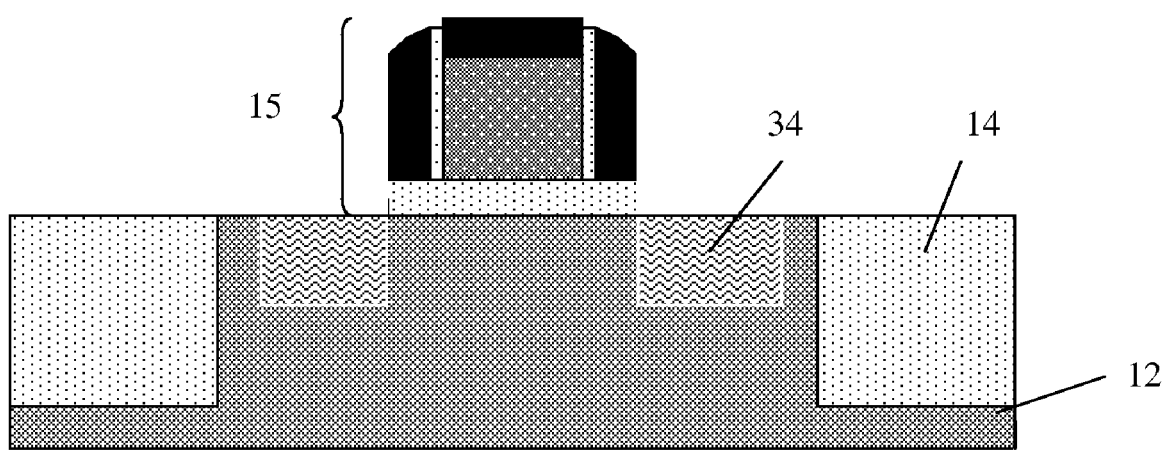
FIG. 12 shows a final structure and respective fabrication processes in accordance with the invention.

In FIG. 12, the oxide layer is stripped using conventional etching processes. This results in a final structure according to the invention. In further processing steps, the source and drain can be implanted with the appropriate dopants such as, for example, arsenic and boron. Extension and halo implantation can also be performed in a conventional manner. For example, an ion implantation is performed in the source/drain regions to form extensions on either side of the gates. Any ion implantation process appropriate for source/drain implantation for the device being fabricated may be used, as is well known in the art. For example, if the doped region is a P-region, this may be implanted, for example, with Boron (B). If the doped region is an N-region, this may be implanted, for example, with Arsenic (As), Antimony (Sb), or Phosphorous (P).

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method comprising:
forming recesses in a substrate on each side of a gate structure and remote from a shallow trench isolation structure by removing a spacer material and etching through an oxide material; and
growing a stress material within the recesses such that the stress material in the recesses is bounded on its side only by the substrate and remote from respective shallow trench isolation structures on source and drain sides of the gate structure.

2. The method of claim 1, wherein the stress material is epitaxially grown in the recesses.

3. The method of claim 1, wherein the stress material is SiGe which is uniformly grown in the recesses.

4. The method of claim 1, wherein the stress material is epitaxially grown SiGe which uniformly grows within the recesses including sides of the substrate in order to eliminate any spaces at a junction between the SiGe and the substrate.

5. The method of claim 1, wherein the oxide material is dielectric layer forming a portion of the gate structure.

6. A method comprising:
forming recesses in a substrate on each side of a gate structure and remote from a shallow trench isolation structure; and
growing a stress material within the recesses such that the stress material is bounded on its side only by the substrate,
wherein the forming recesses comprises:
forming a nitride spacer along a side of the gate structure;
forming a recessed mask along a side of the nitride spacer, wherein an upper portion of the nitride spacer remains exposed; and
performing etching processes to strip the nitride spacer and the substrate to form the recesses.

7. The method of claim 6, wherein the nitride spacers are formed such that they extend only partially to the shallow trench isolation structure.

8. The method of claim 6, further comprising forming the recessed mask on the oxide layer and removing the oxide layer after removal of the recessed mask.

9. A method comprising:
forming recesses in a substrate on each side of a gate structure and remote from a shallow trench isolation structure; and
growing a stress material within the recesses such that the stress material is bounded on its side only by the substrate,
wherein a dimension of the recesses is one half to one times a dimension of the gate structure.

10. A method of forming a device, comprising:
forming a gate structure on a substrate between shallow trench isolation structures;
forming sacrificial spacers on the sides of the gate structure, the sacrificial spacers extending partially to the trench isolation structures;
forming a recessed mask on sides of the sacrificial spacers which is at a height below the sacrificial spacers such that portions of the sacrificial spacers remain exposed;
etching the sacrificial spacers and any intervening material to expose the substrate;
etching the substrate to form recesses which are substantially a same width as the sacrificial spacers; and
growing SiGe material within the recesses such that the SiGe material is bounded on its sides by the substrate and remote from the shallow trench isolation structures,
wherein the sacrificial spacers are formed on an oxide material.

11. The method of claim 10, wherein the oxide material is etched prior to the etching of the substrate.

12. The method of claim 11, wherein the substrate is silicon.

13. The method of claim 12, wherein the sacrificial spacers are nitride spacers.

14. The method of claim 13, wherein the nitride spacers are one half to one times a width of the gate structure.

15. The method of claim 10, wherein the SiGe material is epitaxially grown in the recesses.

16. The method of claim 15, wherein the SiGe material is uniformly grown in the recesses as it only contacts the substrate.

17. The method of claim 16, wherein the SiGe uniformly grows within the recesses including sides of the substrate in order to eliminate and spaces at a junction between the SiGe and the substrate.

18. A structure comprising an embedded localized SiGe in a substrate on sides of a gate structure and remote from shallow trench isolation structures and in contact only with material from the substrate and a top surface of the SiGe being planar with a top surface of the substrate.

19. The structure of claim 18, wherein the substrate is silicon.

20. The structure of claim 18, wherein a junction between the SiGe and the substrate is devoid of any spaces or gaps.

* * * * *